United States Patent
Liao

(10) Patent No.: US 7,909,616 B2
(45) Date of Patent: Mar. 22, 2011

(54) HYBRID CONNECTOR HAVING DIFFERENT CONTACTS FOR ENGAGING WITH DIFFERENT TYPES OF PACKAGES

(75) Inventor: Fang-Jwu Liao, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/850,639

(22) Filed: Aug. 5, 2010

(65) Prior Publication Data

US 2011/0034070 A1 Feb. 10, 2011

(30) Foreign Application Priority Data

Aug. 5, 2009 (TW) .............................. 98214416 U

(51) Int. Cl.
*H01R 12/00* (2006.01)
(52) U.S. Cl. .............................. 439/68; 439/70; 439/525
(58) Field of Classification Search .................... 439/68, 439/71, 73, 330, 525
See application file for complete search history.

(56) References Cited

U.S. PATENT DOCUMENTS

| 7,053,496 | B2 |   | 5/2006 | Stone |
|7,429,497|B2|*|9/2008|Stone ............................ 438/106|
|7,745,912|B2|*|6/2010|Sir ................................. 257/669|
|7,800,391|B2|*|9/2010|Lin et al. ................... 324/756.02|
|7,811,096|B2|*|10/2010|Takagi ............................ 439/71|

* cited by examiner

*Primary Examiner* — Khiem Nguyen
(74) *Attorney, Agent, or Firm* — Andrew C. Cheng; Wei Te Chung; Ming Chieh Chang

(57) ABSTRACT

A hybrid connector used for connecting different package modules includes an insulative housing, a plurality of first type of contacts, and a plurality of second type of contacts. The insulative housing has a first area with a plurality of first openings and a second area with a plurality of second openings. The first contacts and the second contacts are received in the first and the second openings respectively. The first and the second contacts both have a base received in the opening, a spring portion upward extending from the base. A lower portion downwardly extends from the first contact base, and a soldering pad downwardly extends from the second contact base. The first contacts connect with one package module and the second contacts connect with another package module.

8 Claims, 6 Drawing Sheets

HYBRID CONNECTOR HAVING DIFFERENT CONTACTS FOR ENGAGING WITH DIFFERENT TYPES OF PACKAGES

BACKGROUND OF THE INVENTION

1. Field of the Invention

The present invention relates to a hybrid connector, and more particularly to a hybrid connector having at least two types of contacts for electrically connecting at least two types of electronic packages.

2. Description of Related Art

U.S. Pat. No. 7,053,496 issued to Stone on May 30, 2006 discloses a hybrid electronic connector including non-insertable contacts and insertable contacts. The hybrid electronic connector electrically connects with a hybrid electronic package. The hybrid electronic package includes corresponding non-insertable conductive features and insertable conductive features. A vertical securement device applies a vertical compressive force to the electronic package to compress the non-insertable features against the non-sertable contacts. Further, a normal force securement device can be used to provide a sustained normal force to compress the insertable features and the insertable contacts together. Although the hybrid electronic connector has different types of contacts, such as non-insertable contacts and insertable contacts, only one electronic package can received by the electrical connector.

Therefore, an improved electronic connector is needed.

SUMMARY OF THE INVENTION

An object of the present invention is to provide a hybrid connector having at least two types of contacts for electrically connecting at least two types of electronic packages, respectively.

To achieve the aforementioned object, a hybrid connector used for connecting different package modules made in accordance with the present invention comprises in insulative housing, a plurality of first contacts, and a plurality of second contacts. The insulative housing is formed as a rectangular board. The insulative housing has a first area with a plurality of first openings and a second area with a plurality of second openings. The first contact has a first base received in the first opening, a first spring portion upwardly extending from the base, and a lower contacting portion downwardly extending from the base. The first spring portion and the lower portion are symmetrically positioned at a same side of the first base. The second contacts has a second base received in the second opening, a second spring portion upwardly extending from the base, and a soldering pad extending from the base. The first contacts and the second contacts both extend out of a top and a bottom surface of the insulative housing for connecting different types of package modules.

To further achieve the aforementioned object, a hybrid connector assembly made in accordance with the present invention comprises an insulative housing, a plurality of first contacts, a plurality of second contacts, a power chip and a power board, and an electronic package and a printed circuit board. The insulatice housing has at least a first area with a plurality of first openings and a second area with a plurality of second openings, all the openings pass through the insulative housing. The first contact is received in the first opening and includes a first base, a spring portion upwardly extending from the base, and a lower portion downwardly extending from the base. The second contact is received in the second opening and includes a second base, a spring portion upwardly extending from the base, and a soldering pad with a soldering ball located at a bottom of the base. A power chip and a power board connect with the first spring portions and the lower contacting portions of the first contacts respectively. An electronic package and a printed circuit board connect with the second spring portions and the soldering balls of the second contacts, respectively.

Other objects, advantages and novel features of the invention will become more apparent from the following detailed description of a preferred embodiment when taken in conjunction with the accompanying drawings.

DETAILED DESCRIPTION OF THE INVENTION

Figure 1:
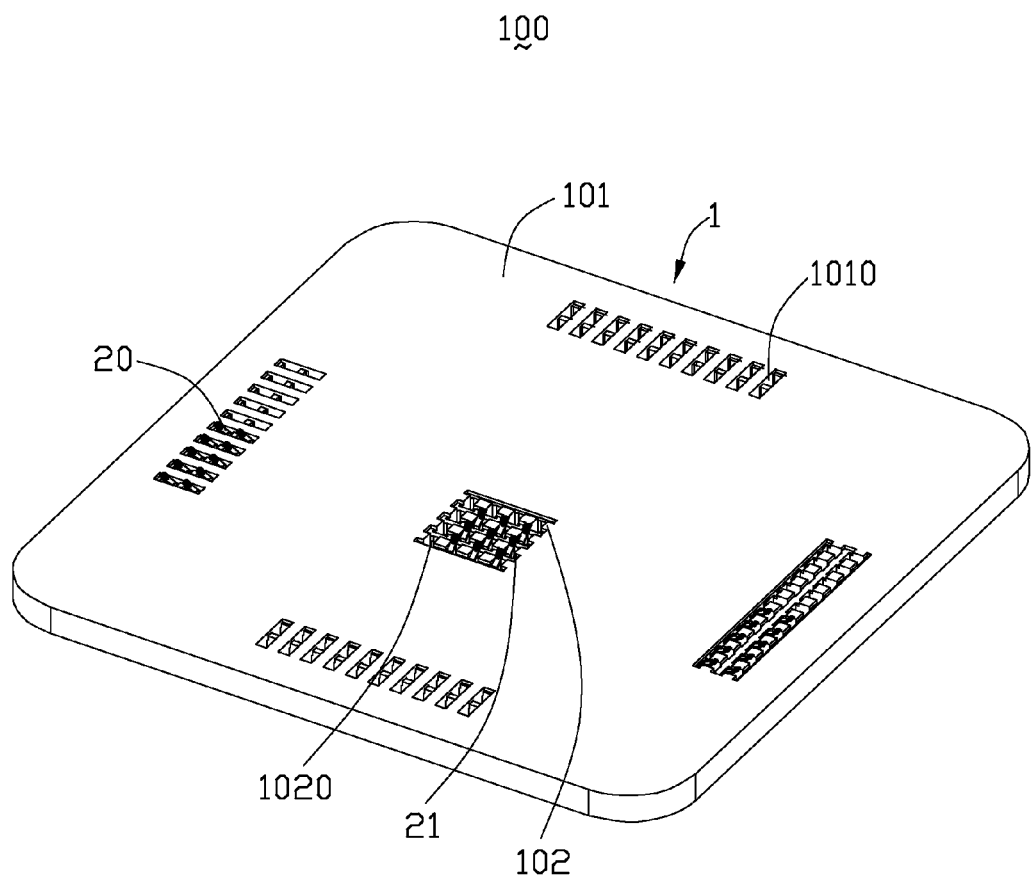
FIG. 1 is an assembly perspective view of an electrical connector in accordance with the present invention.
Figure 2:
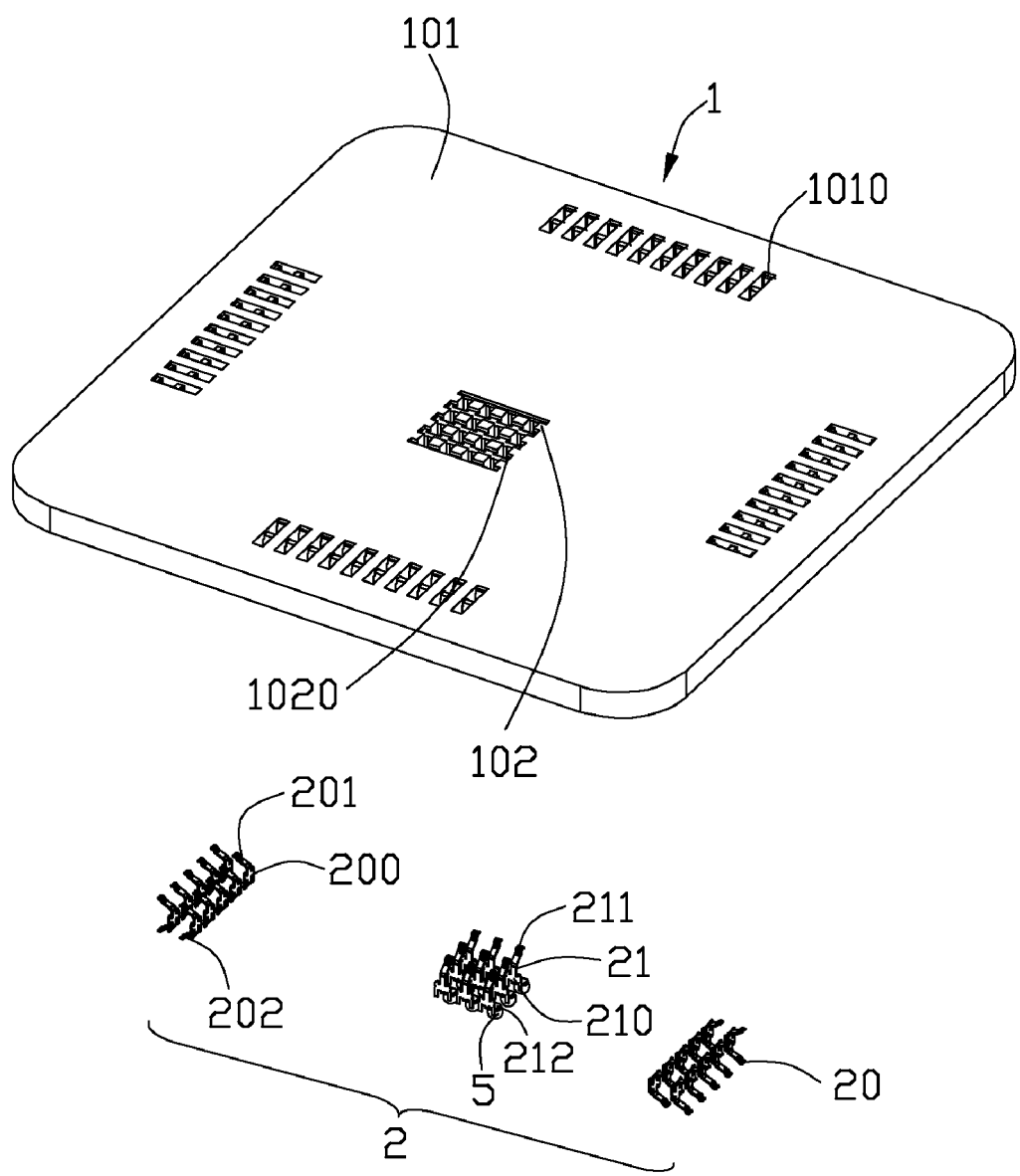
FIG. 2 is an exploded perspective view of the electrical connector of FIG. 1.
Figure 3:
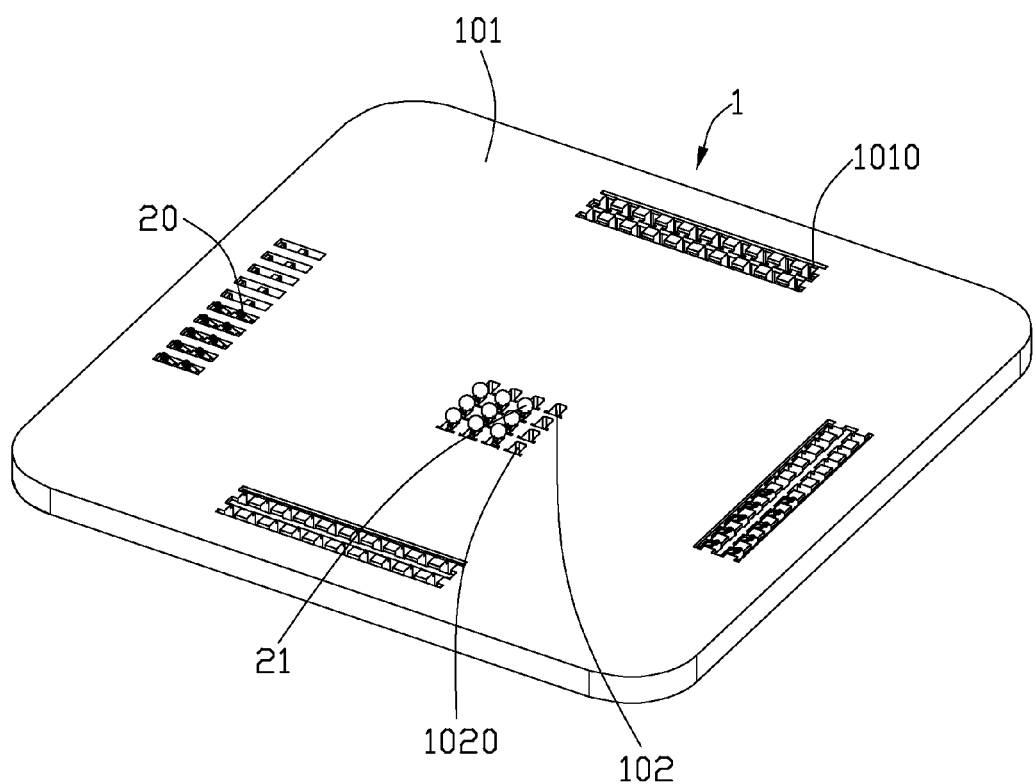
FIG. 3 is similar to FIG. 1, but taken from a bottom side.
Figure 4:
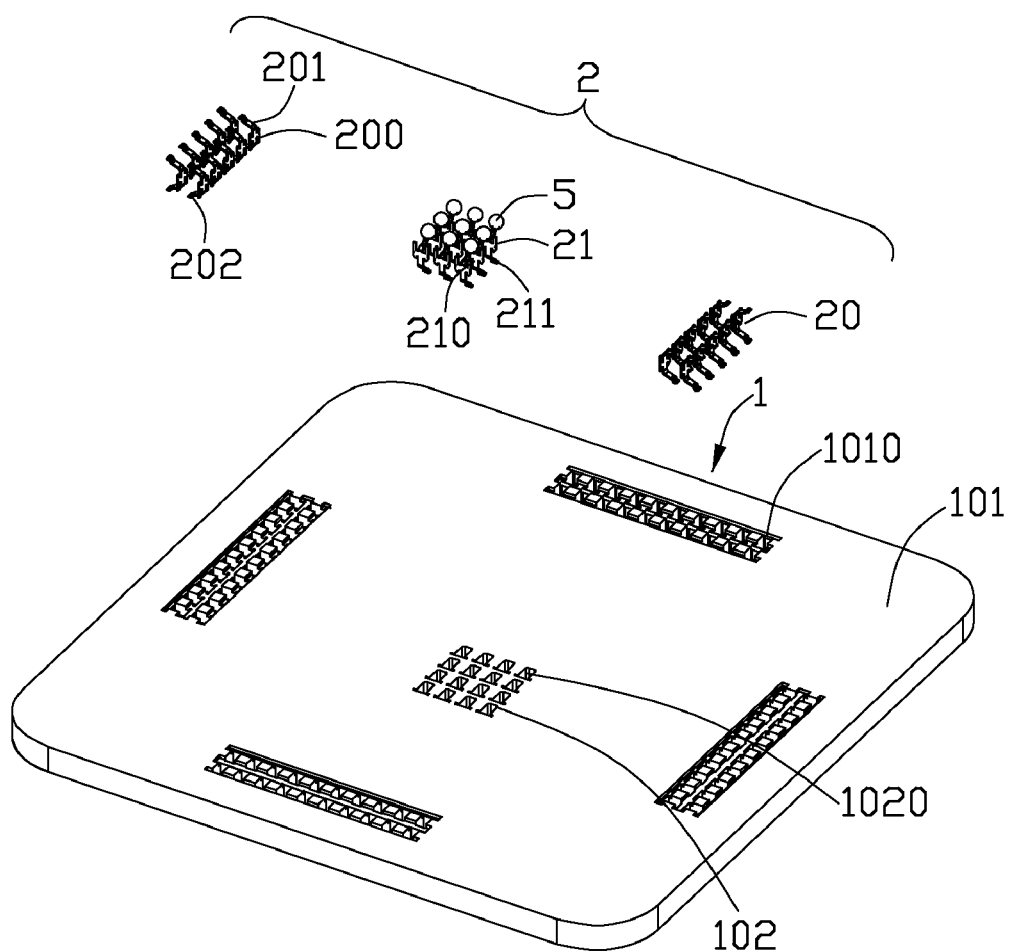
FIG. 4 is similar to FIG. 2, but taken from the bottom side.
Figure 5:
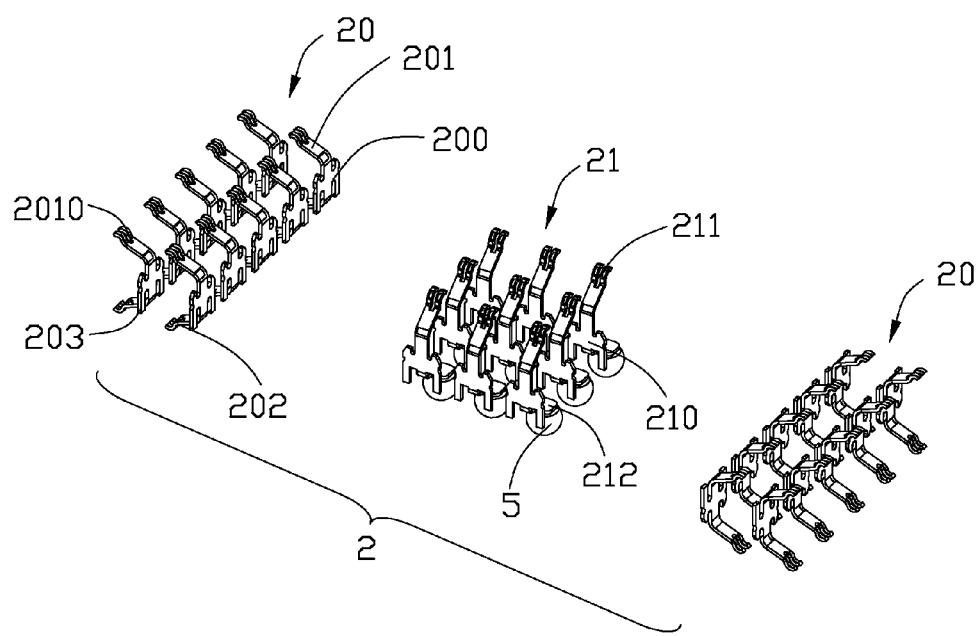
FIG. 5 is a perspective view of contacts of the electrical connector.

FIGS. 1-5, show an electrical connector 100 used to connecting various package modules 3, 4 and various circuit boards 6, 7, comprising an insulative housing 1 and a plurality of contacts 2 mounted in the insulative housing 1. The package modules 3, 4 comprise a plurality of power chips 3 and an electronic package 4. The circuit boards 6, 7 comprise a power boards 6 and a printed circuit board 7.

Referring to FIGS. 2-5, the contacts 2 include a plurality of first contacts 20 and a plurality of second contacts 21. The first contact 20 includes a first base 200, a first spring portion 201, and a lower contacting portion 202. The first base 200 extends in a vertical direction and has a pair of vertical extending retention portions 203. The first spring portion 201 upwardly extends away from the first base 200. The first spring portion 201 has two curved mating portion 2010 each with a mating point. The lower contacting portion 202 downwardly extends from the first base 200 and has the same configuration as the first spring portion 201. The first spring portion 201 and the lower contacting portion 202 are symmetrically positioned at a same side of the first base 200.

The second contact 21 includes a second base 210, a second spring portion 211 upwardly extending upward from the second base 210, and a soldering pad 212 horizontally extending from a bottom of the second base 212. The first and the second contacts 20, 21 have a substantially configuration, the same first and second bases 200, 210, and the same first and the second spring portions 201, 211, except the lower contacting portion 202 and the soldering pad 212. The soldering pad 212 extends from the second base 210 and is bent at a substantially right angle toward the same side of the second base 210 as the second spring portion 211. A soldering ball 5 is soldered on a bottom surface of the soldering pad 212.

Figure 6:
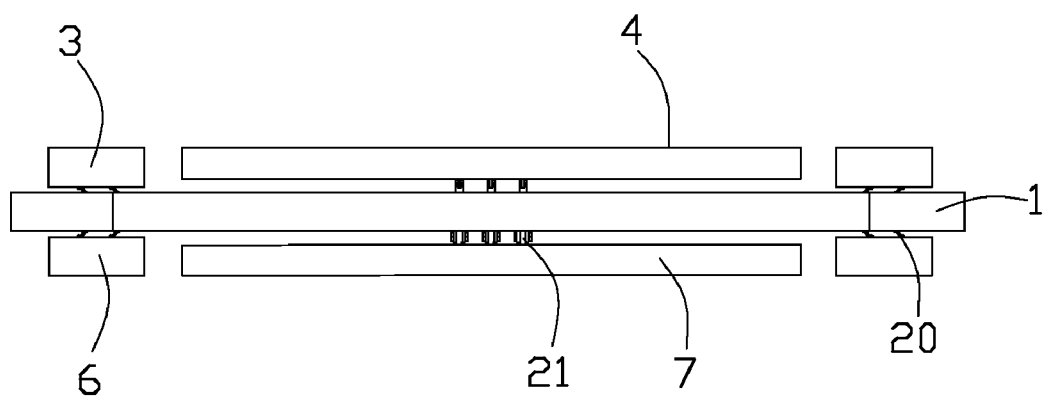
FIG. 6 is a side view of the electrical connector, showing an electronic package and two power chip assembled thereto.

Referring to FIGS. 1-5, the insulative housing 1 has a substantially rectangular shape and is defined in two areas. The center part of the insulative housing 1 defines a second area 102, a first area 101 is located at peripherals four sides of the insulative housing 1. A plurality of first openings 1010 are formed on the first area 101 to receive the first contacts 20. The first spring portions 201 and the lower contacting portions 202 extend beyond a top surface and a bottom surface of the insulative housing 1, respectively. A plurality of second openings 1020 are defined on the second area 102 to retain the second contacts 21. The second spring portions 211 and the soldering pads 212 extend beyond the top surface and the bottom surface of the insulative housing 1, respectively. The soldering balls 5 are omitted from FIG. 6. As shown in FIGS. 1-5, it will be appreciated by those skilled in the art that the amount of the contacts 20, 21 in the first and the second areas 101, 102 can be changed according to the electronic package 4 and the power chip 3.

The first contacts 20 are assembled into the first openings 1010 of the first area 101 from the bottom surface or the top surface of the insulative housing 1, and the second contacts 21 are assembled into the second openings 1020 of the second area 102 from the bottom surface of the insulative housing 2. The first spring portions 201 of the first contacts 20 are pressed by the power chip 3, and the lower contacting portions 202 of the first contacts 20 press the power board 6. The power chip 3 and the power board 6 can be respectively defined as one piece, like a frame, or two pieces, and so on according to the real situation. In present embodiment, the first area 101 is divided into four parts, each part is used for one power chip 3. The second spring portions 211 of the second contacts 21 are pressed by the electronic package 4, and the soldering pads 212 are soldered to the printed circuit board 7 by the soldering balls 5. The power chip 3 and the electronic package 4 can work at the same time, but not affect each other.

It will be obviously understand that more than two types of the contacts can be disposed in the insulative housing for connecting with various types of package modules and various types of boards for achieving different functions.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A hybrid connector used for connecting different package modules, comprising: an insulative housing formed in a rectangular board, the insulative housing having a first area provided with a plurality of first openings and a second area provided with a plurality of second openings; a plurality of first contacts each having a first base received in the first opening, a first spring portion upwardly extending from the base, and a lower contacting portion downwardly extending from the base, the first spring portion and the lower portion symmetrically positioned at a same side of the first base; and a plurality of second contacts each having a second base received in the second opening, a second spring portion upwardly extending from the base, and a soldering pad extending from the base; wherein the first contacts and the second contacts both extend beyond a top and a bottom surface of the insulative housing for connecting different types of package modules, wherein the first area is positioned at peripheral sides of the insulative housing, and the second area is positioned at a center of the insulative housing and surrounded by the first area, wherein the lower contacting portion of the first contact has a same configuration with the first spring portion, and the soldering pad of the second contact is upwardly bent toward the same side of the second base as the second spring portion and has a solder ball disposed thereon.

2. The hybrid connector as claimed in claim 1, wherein the first contact and the second contact have the same configuration, except the lower contacting portion and the soldering pad.

3. The hybrid connector as claimed in claim 2, wherein each of the first spring portion and the second spring portion has two mating portions, each with a mating point, respectively.

4. The hybrid connector as claimed in claim 1, wherein the first contact is used for connecting a power chip.

5. A hybrid connector assembly, comprising: an insulative housing defined at least a first area with a plurality of first openings and a second area with a plurality of second openings, all the openings passing through the insulative housing; a plurality of first contacts received in the first opening and including a first base, a first spring portion upwardly extending from the first base, and a lower portion downwardly extending from the first base; a plurality of second contacts received in the second opening and including a second base, a second spring portion upwardly extending from the second base, and a soldering pad with a soldering ball located at a bottom of the base; a power chip and a power board connecting with the first spring portions and the lower contacting portions of the first contacts respectively; and an electronic package and a printed circuit board connecting with the second spring portions and the soldering balls of the second contacts, respectively, wherein the lower contacting portion has the same configuration as the first spring portion, and the first contact is pressed against both the power chip and the power board, wherein the second spring portion of the second contact is pressed by the electronic package, the soldering pad is soldered to the printed circuit board, wherein the second area is positioned at a center of the insulative housing and surrounded by the first area located at a peripheral of the insulative housing.

6. The hybrid connector assembly as claimed in claim 5, wherein the power chip is formed as a frame.

7. The hybrid connector assembly as claimed in claim 6, wherein the first area is divided into four parts, each part is used for one power chip.

8. An electrical connector assembly for connecting with different electronic components comprising: an insulative plate-like housing with opposite upper and bottom surfaces thereof and defining a center signal transmission region and a peripheral power transmission region essentially surrounding said center signal transmission region; a plurality of signal transmission contacts disposed in the center signal transmission region; and a plurality of power transmission contacts disposed in the peripheral power transmission region; wherein both the signal transmission contacts and the power transmission contacts extend beyond both the upper surface and the bottom surface while with different connection ways for connecting corresponding exterior components which are discrete from each other while being located either both on the top surface or both on the bottom surface, wherein one of said connection ways is soldering while another one is resiliently deflecting, wherein the power transmission contacts in the peripheral power transmission region are differently orientated according to different locations thereof relative to the center signal transmission region.

* * * * *